United States Patent [19]

Rapp

[11] Patent Number: 4,656,374

[45] Date of Patent: Apr. 7, 1987

[54] CMOS LOW-POWER TTL-COMPATIBLE INPUT BUFFER

[75] Inventor: A. Karl Rapp, Los Gatos, Calif.

[73] Assignee: National Semiconductor Corporation, Santa Clara, Calif.

[21] Appl. No.: 745,094

[22] Filed: Jun. 17, 1985

[51] Int. Cl.[4] .................... H03K 3/286; H03K 3/353; H03K 17/04; H03K 17/687

[52] U.S. Cl. ................................. 307/475; 307/451; 307/446; 307/279; 307/570; 307/585; 307/264; 323/317

[58] Field of Search ............... 307/475, 451, 446, 264, 307/570, 585, 576, 579, 279; 323/312, 315, 316, 317

[56] References Cited

U.S. PATENT DOCUMENTS

| | | | |
|---|---|---|---|
| 4,039,862 | 8/1977 | Dingwall et al. | 307/475 X |
| 4,150,308 | 4/1979 | Adlhoch | 307/475 |
| 4,300,091 | 11/1981 | Schade, Jr. | 323/315 |
| 4,359,680 | 11/1982 | Hellums et al. | 323/315 X |
| 4,450,371 | 5/1984 | Bismarck | 307/475 |
| 4,453,094 | 6/1984 | Peil et al. | 323/315 X |
| 4,471,242 | 9/1984 | Noufer et al. | 307/475 |
| 4,486,670 | 12/1984 | Chan et al. | 307/475 X |
| 4,507,573 | 3/1985 | Nagano | 323/315 X |

Primary Examiner—Stanley D. Miller
Assistant Examiner—David R. Bertelson
Attorney, Agent, or Firm—Gail W. Woodward

[57] ABSTRACT

A CMOS buffer is disclosed having a reference potential that provide TTL logic response. The circuit is configured to draw substantially zero current. A reference potential generator develops a potential that is one N channel transistor threshold above about 1.2 volts for TTL compatibility. A single reference potential generator will provide a potential for a plurality of buffers so that its dissipation is low and is shared among the buffers. The result is a low power buffer circuit that is compensated for variations in supply voltage, temperature and device parameters.

8 Claims, 4 Drawing Figures

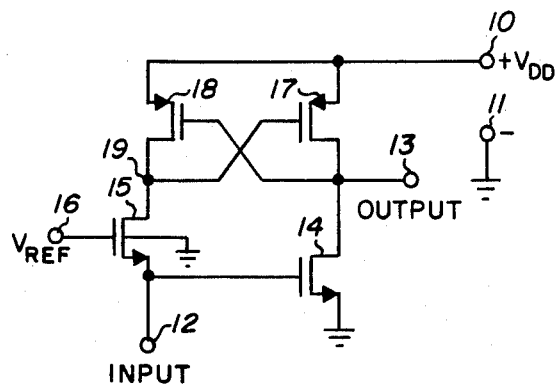
Fig_1
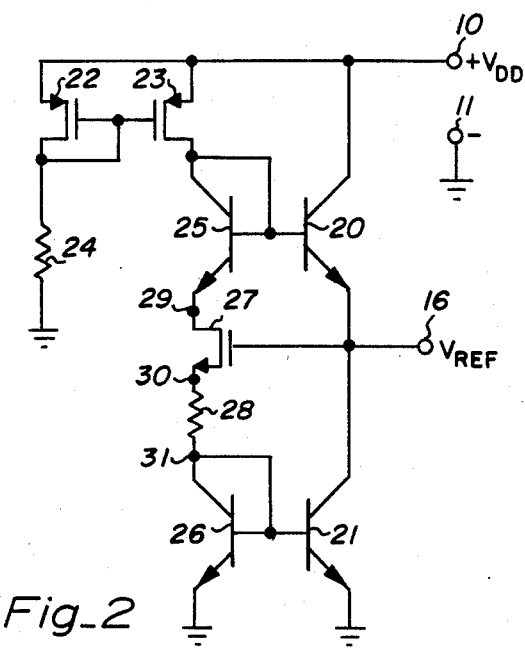
Fig_2
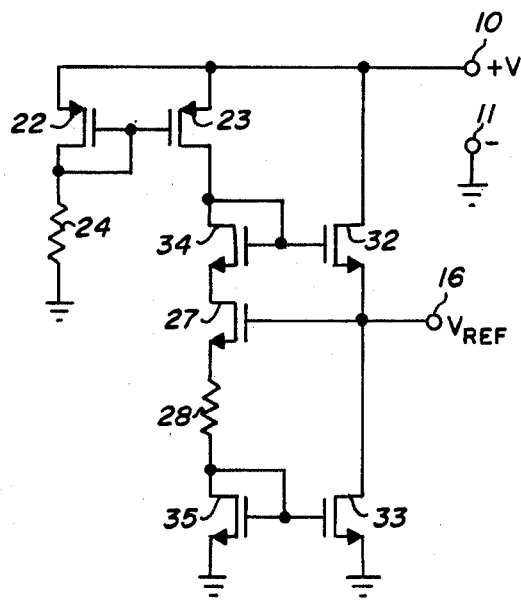
Fig_3
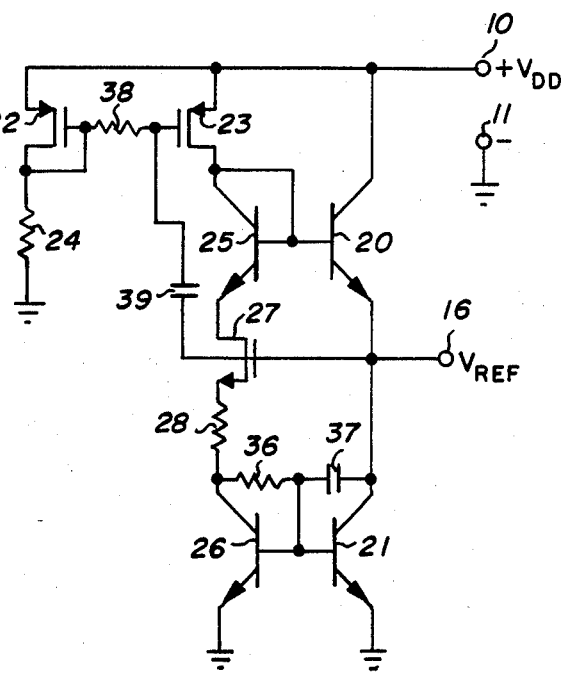
Fig_4

CMOS LOW-POWER TTL-COMPATIBLE INPUT BUFFER

BACKGROUND OF THE INVENTION

Complementary metal oxide semiconductor (CMOS) integrated circuit structures employ complementary insulated gate field effect transistor (IGFET) devices to perform the active circuit functions. The structures involved can also include active bipolar junction transistor (BJT) devices. In a typical prior art CMOS input buffer the usual approach is to employ a conventional inverter having the N channel and P channel devices ratioed to provide the desired switching threshold. The TTL logic levels of 0.8 volt or below for a logic low and 2 volts or above for a logic high are such that for a logic high input both inverter transistors will normally conduct and therefore dissipate power. Regenerative circuit elements can be added to the inverter to aid in logic level discrimination, but these too dissipate power. When the circuit application calls for a large number of input buffers the power dissipation can become a significant problem.

SUMMARY OF THE INVENTION

It is an object of the invention to provide a CMOS buffer that can discriminate between TTL logic levels and dissipate very little power.

It is a further object of the invention to provide a CMOS buffer that provides a large output signal swing and discriminate between TTL logic levels while dissipating very little power.

These and other objects are achieved in the following manner. The circuit input terminal is coupled to the source of a common gate transistor, which has its gate returned to a source of reference potential, and to the gate of a common source transistor. These two transistors have their drains connected to the drains of complementary load transistors which have their gates cross coupled to their respective drains in a latching configuration. The drain of the common source input transistor comprises the stage output terminal. For a logic high input the common source transistor will be turned on to provide a logic low output which turns the common gate transistor's load device on. The common gate transistor is biased to be turned off which turns the load for the common source transistor off. With a logic low input the common gate transistor is biased be turned on and the common source transistor will be off. This provides a logic high output which acts to turn off the common gate transistor's load transistor and turn on the common source transistor's load transistor.

The reference voltage supplied to the common gate transistor is achieved as follows. A totem pole output stage includes a current sink BJT coupled to a current source BJT with their juncture forming the reference voltage point. The sink transistor base is driven by a similar device diode connected to form a current mirror. The current source transistor base is also coupled to a similar device diode connected to form a current mirror therewith. The two mirrors are connected together through an N channel IGFET having its control electrode returned to the reference voltage point. Thus, the devices form a dual current mirror, the input current to which will determine the current flowing in the totem pole output stage.

BRIEF DESCRIPTION OF THE DRAWING

FIG. 1 is a schematic diagram of the basic buffer circuit of the invention.

FIG. 2 is a schematic diagram of the circuit employed in developing the reference potential for the circuit of FIG. 1.

FIG. 3 is a schematic diagram of an alternative circuit for developing the reference potential.

FIG. 4 is a schematic diagram of the circuit of FIG. 2 with added transient arresting circuits.

DESCRIPTION OF THE INVENTION

FIG. 1, is a schematic diagram of the buffer circuit of the invention. An operating power supply $V_{DD}$ is connected + to terminal 10 and − to ground terminal 11. Logic signals applied to input terminal 12 appear inverted at output terminal 13. A common source N channel IGFET 14 acts as an inverting amplifier responsive to the logic input. N channel IGFET 15 is connected as a common gate device that establishes the logic response level. The gate of transistor 15 is coupled to $V_{REF}$ terminal 16 which is returned to a suitable source of potential which will be described in detail hereinafter. $V_{REF}$ is typically one $V_{TN}$ (one N channel transistor threshold) above the logic switching reference. $V_{REF} = V_{TN} + 1.2$ for TTL logic. It will be noted that this reference level of 1.2 volts is well above the TTL logic low of 0.8 volt and well below the TTL logic high of 2 volts.

P channel IGFET's 17 and 18 respectively serve as loads for transistors 14 and 15. The gates of transistors 17 and 18 are cross coupled to their respective drains so as to create a regenerative or latching load action.

With a logic low at terminal 12 transistor 14 will be turned off and transistor 15 will be turned on. This will pull node 19 down so as to turn transistor 17 on. Thus, output terminal 13 will be close to $+V_{DD}$. This action will turn off transistor 18. It can be seen that there is an off transistor in each of the branches of the circuit which therefore will draw no current.

In the logic high state at terminal 12 transistor 14 will be turned on and transistor 15 wil be turned off. This action will pull output terminal 13 close to ground and thereby turn transistor 18 on. This will pull node 19 close to $+V_{DD}$ and turn off transistor 17. Again, each branch has an off transistor so the circuit will draw no current.

It will be noted that the back gate of transistor 15 is returned to ground. This will be the normal case in CMOS construction because all N channel IGFET's have their back gates in common on a P type semiconductor substrate which is connected to the negative supply rail. This back gate connection involves the well-known body effect in IGFET devices. When input terminal 12 is low, the body effect reduces the threshold of transistor 15 thereby aiding its turn on. When input terminal 12 is high, the body effect increases the threshold of transistor 15 thereby aiding its turn off. This body effect acts to increase the apparent gain of transistor 15 and accentuates its switching between the on and off states.

FIG. 2 is a schematic diagram of a preferred circuit for developing $V_{REF}$ that is applied to terminal 16 of FIG. 1. It will be used where NPN BJT devices are available on the CMOS circuit chips. NPN transistors 20 and 21 are coupled in totem pole fashion between the power supply rails. Their juncture operates at the $V_{REF}$ potential in the following manner.

P channel IGFET's 22 and 23 form a current mirror the input of which is developed by current flowing in resistor 24. For small current levels (relatively large resistor 24), this current will approximate:

$$I = \frac{V_{DD} - V_{TP}}{R_{24}}$$

where $V_{TP}$ is the threshold voltage of a P channel transistor $R_{24}$ is the resistance of resistor 24. If transistors 22 and 23 are the same size the same current will flow in transistor 23 and the circuit elements connected in series therewith. NPN BJT 25 is diode connected to drive BJT 20 as a current mirror. BJT 26 is diode connected to drive BJT 21 as a current mirror. Typically transistors 20 and 21 are ratioed larger than transistors 25 and 26 so that the current flowing in transistors 20 and 21 is a multiple of I.

N channel IGFET 27 and resistor 28 are coupled in series with transistors 25 and 26 so that I flows in them also. The gate of IGFET 27 is returned to $V_{REF}$ terminal 16 to create a stabilizing negative feedback loop in the control circuit. The base of transistor 20 will be $V_{BE}$ above $V_{REF}$. Since transistor 25 will have the same $V_{BE}$ node 29 will also be at $V_{REF}$. Thus, node 30 will be approximately $V_{TN}$ (one N channel IGFET threshold) below $V_{REF}$. Node 30 will be at a potential:

$$V_{30} = V_{BE26} + IR_{28}$$

where:
$V_{BE26}$ is the base to emitter voltage of transistor 26
$R_{28}$ is the value of resistor 28

Since resistor 28 is ratioed to resistor 24 and resistor 24 sets the current level I, the voltage drop across resistor 28 is relatively constant and independent of process variation. In effect, the voltage drop across resistor 28 in combination with the $V_{BE}$ of BJT 26 determines the voltage at node 30 and $V_{REF} = V_{30} + V_{TN}$.

While the $V_{REF}$ circuit of FIG. 2 draws current the actual value can be kept small and a single such circuit can provide a reference potential for a plurality of buffers of the kind disclosed in FIG. 1. In the example to be given sixteen such buffers will be coupled to one reference circuit.

FIG. 3 is a schematic diagram of an all IGFET version of the reference circuit. This circuit form will be used where the CMOS circuit chips do not include NPN BJT's. Transistors 20, 21, 25 and 26 of FIG. 2 have been replaced by N channel IGFET's 32 through 35 respectively. The circuit operates as explained above except that $V_{TN}$ will replace $V_{BE}$.

It can be seen from FIG. 1 that the logic signals applied to terminal 12 will be coupled to terminal 16 via the gate to source capacitance of transistor 15. When a plurality of such buffers are commonly coupled to a single reference circuit the resulting logic signal transients can be substantial. FIG. 4 shows a version of the FIG. 2 circuit modified to reduce the effects of such transients. Resistor 36 is coupled between the collector and base of transistor 26 and capacitor 37 is coupled between the base and collector of transistor 21. Resistor 38 is coupled between the gates of transistors 22 and 23 and capacitor 39 is coupled from the gate of transistor 23 to the gate of transistor 27. These transient suppressing R.C. networks render terminal 16 substantially immune to the logic switching transients.

Example

The circuits of FIGS. 1 and 2 were simulated to determine the effects of transistor parameters, temperature and $V_{DD}$. The simulation employed a program that has been highly successful in predicting the behavior of CMOS circuits. Sixteen buffers were coupled to a single reference generator. The following component values were employed.

| COMPONENT | VALUE* | UNITS |
|---|---|---|
| Transistor 14 | 85/2 | microns |
| Transistor 15 | 140/2 | microns |
| Transistor 17 | 25/2 | microns |
| Transistor 18 | 15/2 | microns |
| Transistors 22 and 23 | 450/4 | microns |
| Resistor 24 | 23K | ohms |
| Transistor 27 | 140/2 | microns |
| Resistor 28 | 6.5K | ohms |

*The dual numbers are W/L ratios.

The NPN transistors were of high Beta construction and transistors 20 and 21 were ratioed at 5 times the size of transistors 25 and 26. $V_{DD}$ was varied from 4.5 to 5.5 volts, temperature was varied from $-40°$ C. to $+120°$ C., and transistor parameters were varied over the extreme ranges normally encountered in processing. The buffer propagation delay varied over 2 to 7 ns. The quiescent current was 1.2 ma maximum. By contrast prior art buffers for similar speed performance typically draw about 1.5 ma which would translate to 24 ma for sixteen such circuits. Thus, the circuit of the invention produces a twenty times improvement in dissipated power.

The invention has been described and an operating example detailed. When a person of ordinary skill in the art reads the foregoing description, alternatives and equivalents, within the spirit and intent of the invention, will be apparent. Accordingly, it is intended that the scope of the invention be limited only by the claims that follow.

I claim:

1. A CMOS buffer amplifier circuit having first and second supply rails connectable to a source of operating power, an input terminal connectable to a source of logic signals and an output terminal for producing an inverted version of said logic signals, said circuit comprising:
   a first IGFET having a source coupled to said second supply rail, a gate coupled to said input terminal and a drain coupled to said output terminal;
   a second IGFET of the same conductivity type at the first IGFET, having a source coupled to said input terminal, a gate coupled to a source of reference potential and a drain; and
   third and fourth complementary IGFET's having their sources coupled to said first supply rail, their drains coupled respectively to said first and second IGFET's and their gates cross coupled to the opposite drains to create a latching load configuration.

2. The circuit of claim 1 further including means for coupling the back gate of said second IGFET to said second supply rail whereby the body effect increases the effective gain of said second IGFET.

3. The circuit of claim 1 wherein said first and second IGFET's are N channel transistors and said pair of complementary IGFET's are P channel transistors.

4. The circuit of claim 1 wherein said source of reference potential is operated at close to one IGFET threshold above about 1-2 volts whereby said circuit responds to TTL logic input signals.

5. The circuit of claim 1 wherein said source of reference potential appears at a reference potential terminal and is developed in a circuit comprising:
- a first BJT having its collector coupled to said reference potential terminal and its emitter coupled to said second supply rail;
- a second BJT having its collector coupled to said first supply rail and its emitter coupled to said reference potential terminal;
- a third BJT having its emitter coupled to said second supply rail and its collector and base coupled together to the base of said first BJT to form a current mirror therewith;
- a fourth BJT having its collector and base coupled together and to the base of said second bipolar transistor to form a current mirror therewith;
- a fifth IGFET of the same conductivity type as said first IGFET having its drain coupled to the emitter of said fourth BJT, its source coupled by way of a first resistor to said collector of said third BJT and its gate coupled to said reference potential terminal; and
- means for passing a controlled current through said third and fourth BJT's and said fifth IGFET.

6. The circuit of claim 5 wherein said means for passing a controlled current comprises:
- a sixth IGFET of said complementary type having its source coupled to said first supply rail and its drain coupled to said fourth BJT collector and base terminals;
- a seventh IGFET of said complementary type having its source coupled to said first supply rail and its gate and drain coupled together to said sixth IGFET gate to form a current mirror therewith; and
- a second resistor coupled between said seventh IGFET drain and said second supply rail to establish an input current for said reference circuit.

7. The circuit of claim 1 wherein said source of reference potential appears at a reference potential terminal and is developed in a circuit comprising:
- a fifth IGFET of said same conductivity type and having its drain coupled to said reference potential terminal, its source coupled to said second supply rail and a gate;
- a sixth IGFET of said same conductivity type and having its source coupled to said reference terminal, its drain coupled to said first supply rail and a gate;
- a seventh IGFET of said same conductivity type and having its source coupled to said second supply rail and its gate and drain coupled to said fifth IGFET to provide a current mirror therewith;
- an eighth IGFET of said same conductivity type and having its gate and drain coupled to said gate of said sixth IGFET to provide a current mirror therewith;
- a ninth IGFET having its drain coupled to the source of said eighth IGFET, its gate coupled to said reference potential terminal and its source coupled via a first resistor to the drain of said seventh IGFET; and
- means for passing a controlled current through said seventh, eighth and ninth IGFET's.

8. The circuit of claim 7 wherein said means for passing a controlled current comprises:
- a tenth IGFET of said complementary type and having its source coupled to said first supply rail, its drain coupled to said drain of said eighth IGFET and a gate;
- an eleventh IGFET of said complementary type and having its source coupled to said first supply rail, its gate and drain coupled together to said gate of said tenth IGFET to provide a current mirror therewith; and
- a second resistor coupled between said drain of said eleventh IGFET and said second supply rail.

* * * * *